United States Patent
Hahn

(10) Patent No.: US 11,831,298 B2
(45) Date of Patent: Nov. 28, 2023

(54) SYSTEM AND METHOD FOR FILTER ENHANCEMENT

(71) Applicant: Kumu Networks, Inc., Sunnyvale, CA (US)

(72) Inventor: Wilhelm Steffen Hahn, Sunnyvale, CA (US)

(73) Assignee: Kumu Networks, Inc., Sunnyvale, CA (US)

(*) Notice: Subject to any disclaimer, the term of this patent is extended or adjusted under 35 U.S.C. 154(b) by 0 days.

(21) Appl. No.: 18/096,171

(22) Filed: Jan. 12, 2023

(65) Prior Publication Data

US 2023/0223927 A1 Jul. 13, 2023

Related U.S. Application Data

(60) Provisional application No. 63/298,934, filed on Jan. 12, 2022.

(51) Int. Cl.
| | |
|---|---|
| *H03H 9/46* | (2006.01) |
| *H03H 9/54* | (2006.01) |
| *H03H 11/16* | (2006.01) |
| *H03H 11/24* | (2006.01) |
| *H03H 11/26* | (2006.01) |
| *H03H 9/02* | (2006.01) |

(52) U.S. Cl.
CPC ............ *H03H 9/54* (2013.01); *H03H 11/16* (2013.01); *H03H 11/24* (2013.01); *H03H 11/26* (2013.01); *H03H 9/02102* (2013.01); *H03H 9/02834* (2013.01)

(58) Field of Classification Search
CPC ............ H03H 9/46; H03H 9/465; H03H 9/52; H03H 9/54; H03H 9/542; H03H 11/16; H03H 11/24; H03H 11/26
USPC ....... 327/513, 551, 552, 553, 554, 555, 556, 327/557, 558, 559
See application file for complete search history.

(56) References Cited

U.S. PATENT DOCUMENTS

| | | | |
|---|---|---|---|
| 10,491,313 B2 * | 11/2019 | Jain | ........................ H04B 15/02 |
| 2009/0140773 A1 | 6/2009 | Cheung | |
| 2016/0127112 A1 | 5/2016 | Shalizi et al. | |
| 2019/0140643 A1 | 5/2019 | Kuenemund | |
| 2019/0349227 A1 | 11/2019 | Kim et al. | |
| 2021/0270935 A1 | 9/2021 | McMahon et al. | |

* cited by examiner

*Primary Examiner* — Hai L Nguyen
(74) *Attorney, Agent, or Firm* — Jeffrey Schox; Samuel Rosenthal

(57) ABSTRACT

A system for filter enhancement, preferably including one or more analog taps and a controller, and optionally including one or more couplers. The system is preferably configured to integrate with a filter, such as a passband filter or other frequency-based filter. The system can be configured to integrate with an RF communication system, an RF front end, or any other suitable RF circuitry. A method for filter enhancement, preferably including configuring one or more analog taps, and optionally including calibrating a system for filter enhancement and/or receiving temperature information.

14 Claims, 4 Drawing Sheets

SYSTEM AND METHOD FOR FILTER ENHANCEMENT

CROSS-REFERENCE TO RELATED APPLICATIONS

This application claims the benefit of U.S. Provisional Application Ser. No. 63/298,934, filed on 12 Jan. 2022, which is incorporated in its entirety by this reference.

TECHNICAL FIELD

This invention relates generally to the filters field, and more specifically to a new and useful system and method for filter enhancement.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview

Figure 1A:
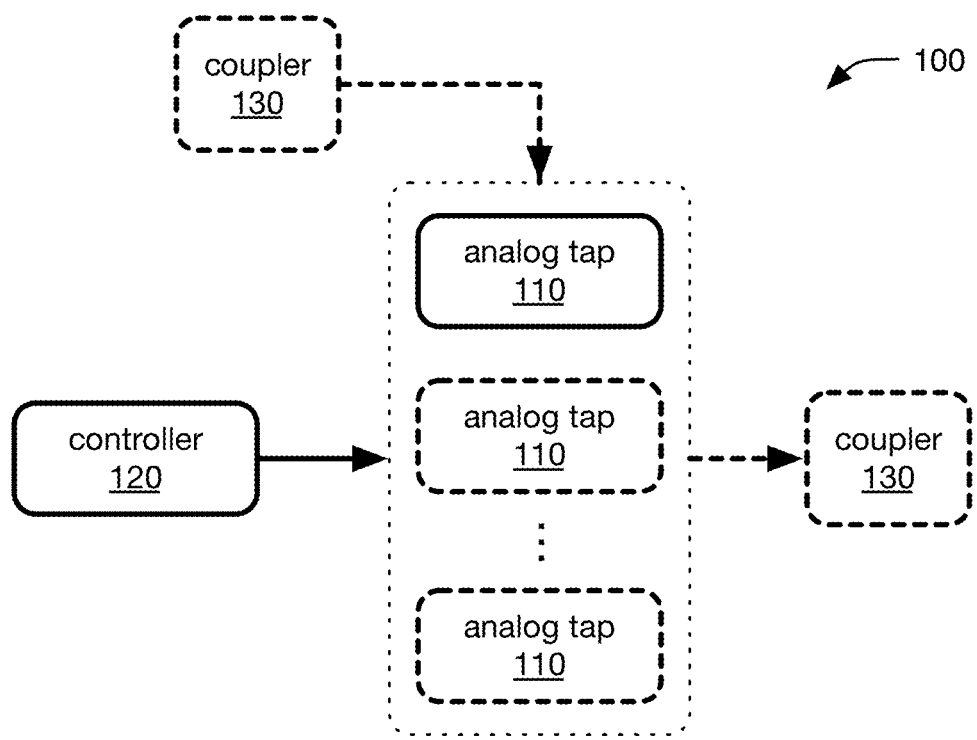
FIG. 1A is a schematic representation of an embodiment of a system for filter enhancement.

A system 100 for filter enhancement preferably functions to enhance performance of a filter (e.g., passband filter). The system 100 preferably includes one or more analog taps 110 and a controller 120, and can optionally include one or more couplers 130 (e.g., as shown in FIG. 1A). However, the system 100 can additionally or alternatively include any other suitable elements in any suitable arrangement.

Figure 1B:
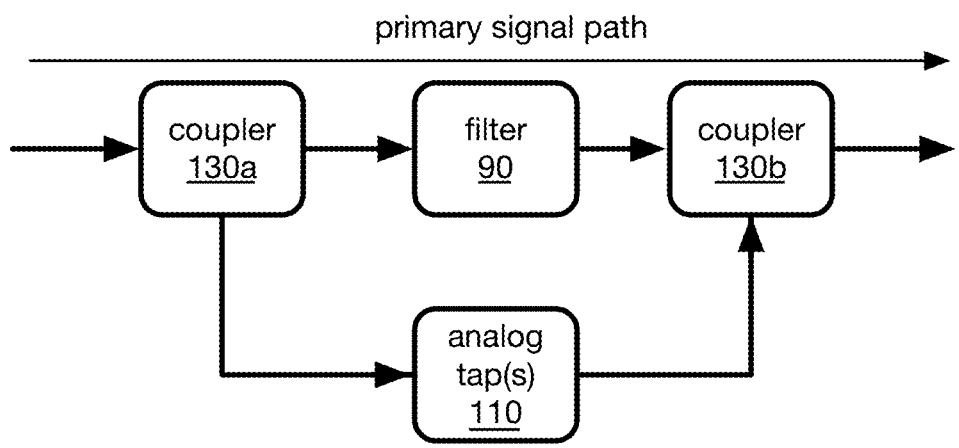
FIG. 1B is a schematic representation of an example of the system integrated with a filter.

The system 100 is preferably configured to integrate with a filter 90. The filter 90 is preferably a frequency filter (e.g., configured to pass signals within one or more passbands and/or attenuate signals in one or more stopbands), more preferably a passband filter, but can additionally or alternatively include any other suitable filters. The filter 90 is preferably an analog filter, but can additionally or alternatively include a digital filter and/or any other suitable filters. In specific examples, the filter 90 can include a BAW filter, a SAW filter, a ceramic filter, a discrete LC filter, and/or any other suitable filter types. In some embodiments, the filter 90 can be arranged along a primary signal path, and the system 100 can be coupled (or configured to be coupled) to the primary signal path in parallel with the filter 90 (e.g., as shown in FIG. 1B); however, the filter 90 and system 100 can have (or be configured to have) any other suitable coupling relative to each other. In some examples, the system 100 can optionally be configured to integrate with a radio frequency (RF) communication system or any suitable elements thereof, such as an RF front end. For example, the system 100 can be configured to integrate with a front end including the filter 90, one or more power amplifiers, and/or any other suitable elements.

The system 100 is preferably defined as and/or in one or more integrated circuits (ICs). In a first example, the system 100 (or a subset thereof) is defined in an IC (e.g., packaged as a chip) configured to be coupled to the filter 90 (e.g., coupled to the primary signal path in parallel with the filter 90). In a second example, the system 100, or a subset thereof, along with one or more elements of an RF communication system (e.g., the filter 90, other RF elements, the entire RF front end, etc.) are defined together in a single IC (e.g., packaged as a chip) and/or defined in neighboring ICs (e.g., co-packaged ICs). However, the system 100 can additionally or alternatively be defined in any other suitable manner.

Figure 6:
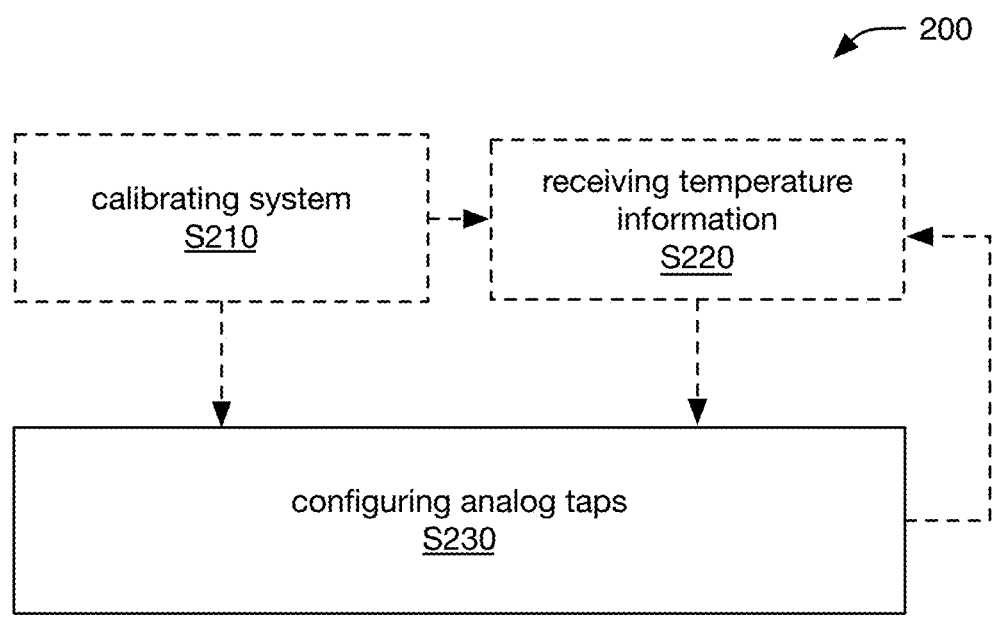
FIG. 6 is a schematic representation of an embodiment of a method for filter enhancement.

A method 200 for filter enhancement is preferably performed using the system 100 described herein. The method 200 preferably functions to control the system 100 to enhance performance of the filter 90 (e.g., to reduce or eliminate temperature dependence of the filter 90, to create or enhance attenuation within one or more stopbands defined by the filter 90 and/or any suitable subset thereof, etc.). The method 200 preferably includes configuring one or more analog taps S230, and can optionally include calibrating the system S210 and/or receiving temperature information S220 (e.g., as shown in FIG. 6). However, the method can additionally or alternatively include any other suitable elements performed in any suitable manner.

2. Benefits

Variants of the technology (e.g., the system 100 and/or method 200) can confer one or more benefits.

First, in some variants, the technology can enable isolation of different transmissions (e.g., frequency-multiplexed transmissions), such as in cellular networks and/or Wi-Fi communication schemes. For example, variants of the technology can enable and/or enhance isolation in networks using Wi-Fi communication schemes, such as Wi-Fi 4, 5, 6, 7, and/or other generations (e.g., communication schemes codified in one or more IEEE 802.11 standards, such as 802.11a, 802.11b, 802.11g, 802.11n, 802.11ac, 802.11ax, and/or 802.11be, each of which are herein incorporated in their entireties by this reference).

Second, variants of the technology can avoid and/or reduce the need for complicated impedance matching, and/or can significantly reduce insertion losses, as compared with systems including a series arrangement of multiple filters (e.g., passband filters).

Third, variants of the technology can reduce system complexity, expense, and/or insertion losses as compared with parallel arrangements of multiple filters (e.g., passband filters), such as switched arrangements enabling selection of one out of a plurality of different filters. In some examples, the number of filters in a filter bank with parallel filters (e.g., passband filters) may be reduced (or alternatively, the filter bank may be replaced by a single filter), due to performance enhancement of some or all filters of the filter bank by use of the technology.

Fourth, variants of the technology can enable cancellation and/or reduction of filter temperature dependences. For example, variants of the technology can enable maintenance of the filter skirt at or near a desired frequency and/or slope, such as through dynamic tuning of one or more analog taps in response to changes in temperature and/or changes in filter response.

Fifth, variants of the technology can enable the creation and/or enhancement of one or more high-attenuation stopbands (e.g., past the filter edge). In a first example, one or more analog taps of the technology can be used to extend a stopband from the filter skirt. In a second example, one or more analog taps of the technology can be used to enhance attenuation farther from the skirt (e.g., within, such as centered in, a neighboring transmission band).

Sixth, variants of the technology can enable autonomous enhancement of filter performance. For example, the use of one or more sensors (e.g., temperature sensors) coupled with logic that determines analog tap settings based on the sensor readings (e.g., based on one or more lookup tables indexed by the sensor readings) can enable dynamic tuning of the analog tap(s) in response to changing circumstances (e.g., changing temperature).

However, variants of the technology can additionally or alternatively confer any other suitable benefits, and/or can confer no such benefits.

3. System 3.1 Analog Taps

Figure 1C:
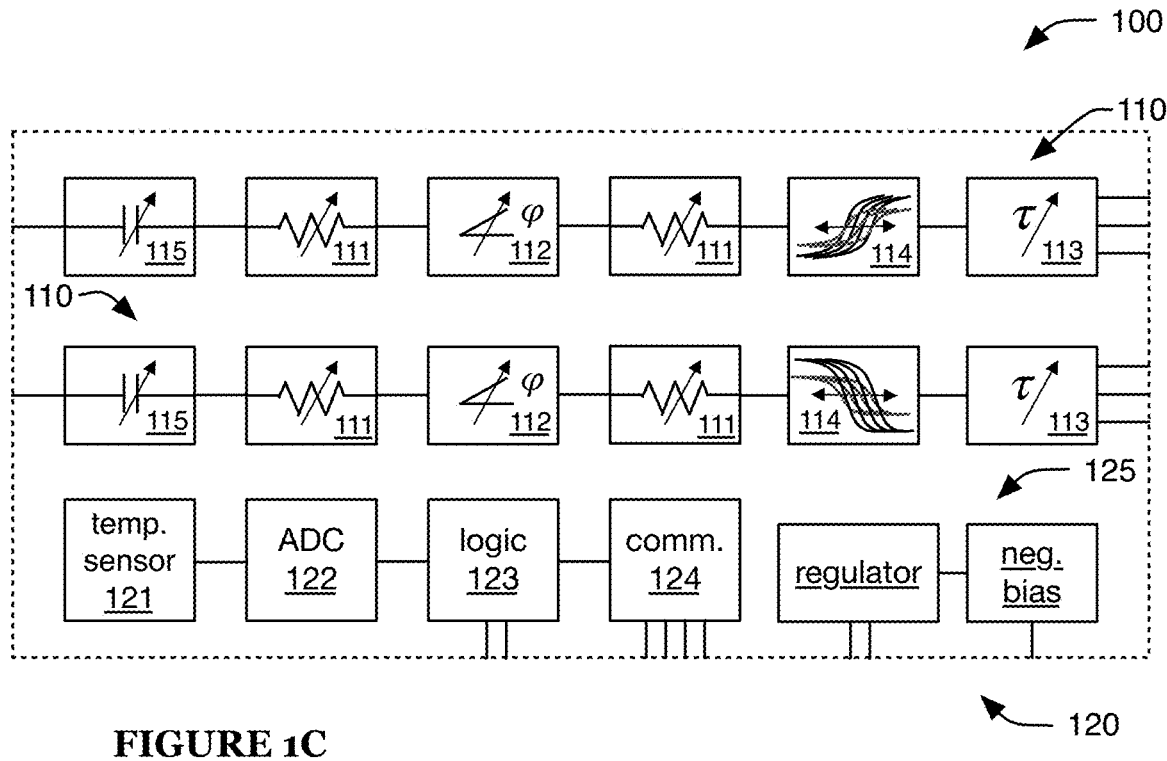
FIG. 1C is a schematic representation of a specific example of the system.

The system 100 preferably includes one or more analog taps 110, such as including a plurality of analog taps (e.g., 2, 3, 4, or more analog taps), such as shown by way of example in FIGS. 1A-1C. Each analog tap preferably functions to perform filter enhancement (e.g., temperature dependence reduction, stopband enhancement, etc.) within a desired frequency band (e.g., wherein each analog tap can be responsible for filter enhancement within a different frequency band). In examples including a plurality of analog taps, the different analog taps are preferably arranged in parallel within the circuit (e.g., wherein each analog tap is electrically coupled in parallel with all the other analog taps and with the filter 90).

Each analog tap preferably includes one or more scalers 111, phase shifters 112, delays 113, tap filters 114, and/or coupling tuners 115 (e.g., as shown in FIGS. 1C and/or 2A-2B), and can additionally or alternatively include any other suitable elements. A person of skill in the art will recognize that the scaler(s), phase shifter(s), delay(s), filter(s), coupling tuner(s), and/or any other suitable elements can be arranged in any suitable order within the analog tap (e.g., order relative to signal propagation through the analog tap); for example, a scaler can be arranged before the phase shifter (e.g., wherein the analog tap first scales and then phase shift signals propagating through the analog tap) and/or after the phase shifter (e.g., wherein the analog tap first phase shifts and then scales signals propagating through the analog tap).

The scaler 111 preferably functions to scale (e.g., attenuate and/or amplify) the amplitude of the signal propagating through the analog tap. Each scaler is preferably an attenuator (e.g., configured to attenuate signal intensity), but can additionally or alternatively include an amplifier (e.g., configured to amplify signal intensity) and/or any other suitable scaling element. The scaler is preferably operable to be configured between different scaling factors, such as operable to be controlled throughout a continuum of possible scale values (e.g., operable to scale the propagating signal by any factor between 1 and a minimum value, such as 0.1, 0.03, 0.01, etc.); however, the scaler can additionally or alternatively be operable to switch between a plurality of different scaling elements (e.g., fixed scaling elements, such as resistors of fixed resistance). In some examples, the analog tap can include a plurality of scalers (e.g., attenuators), such as a first scaler upstream of the phase shifter and a second scaler downstream of the phase shifter; in some examples, such use of multiple scalers can function to increase the scaling range achievable by the analog tap (e.g., by the plurality of scalers). However, the analog taps can additionally or alternatively include any other suitable scalers.

The phase shifter 112 preferably functions to shift the phase of the signal propagating through the analog tap. The phase shifter is preferably operable to be configured between different phase shift amounts, such as operable to be controlled throughout a continuum of possible phase shift values (e.g., operable to shift the phase of the propagating signal by any value between 0 and a maximum value, such as $2\pi$, $\pi$, $\pi/2$, or $\pi/4$ radians, etc.); however, the phase shifter can additionally or alternatively be operable to switch between a plurality of different phase shift elements (e.g., fixed phase shift elements configured to impose a fixed amount of phase shift on all signals). However, the analog taps can additionally or alternatively include any other suitable phase shifters.

The delay 113 preferably function to delay the signal propagating through the analog tap. The delay is preferably operable to be configured between different delay times. In a first variant, the delay is operable to be controlled throughout a continuum of possible delay values (e.g., operable to delay the propagating signal by any value between a minimum value, such as 0 or a value greater than zero, and a maximum value). In a second variant, the delay is operable to switch between a plurality of different delay elements (e.g., each configured to impose a different amount of delay time), such as switching between one or more fixed delay values and/or substantially zero delay.

In some examples, the switchable delay includes a plurality of delay segments (e.g., meandering traces) and a switch network operable to enable or disable each delay segment independently (e.g., wherein, for each delay segment, the switch network preferably defines a bypass path that, when the switch network is configured appropriately, is operable to carry signals in a manner that bypasses the delay segment, such as wherein the bypass path includes a plurality of bypass segments, one associated with each delay segment and operable to carry signals in a manner that bypasses the associated delay segment). Each delay segment is preferably associated with (e.g., configured to impose) a different amount of delay time (e.g., wherein each delay segment defines a different signal propagation pathlength, such as having a trace meander of a different length).

Figure 3:
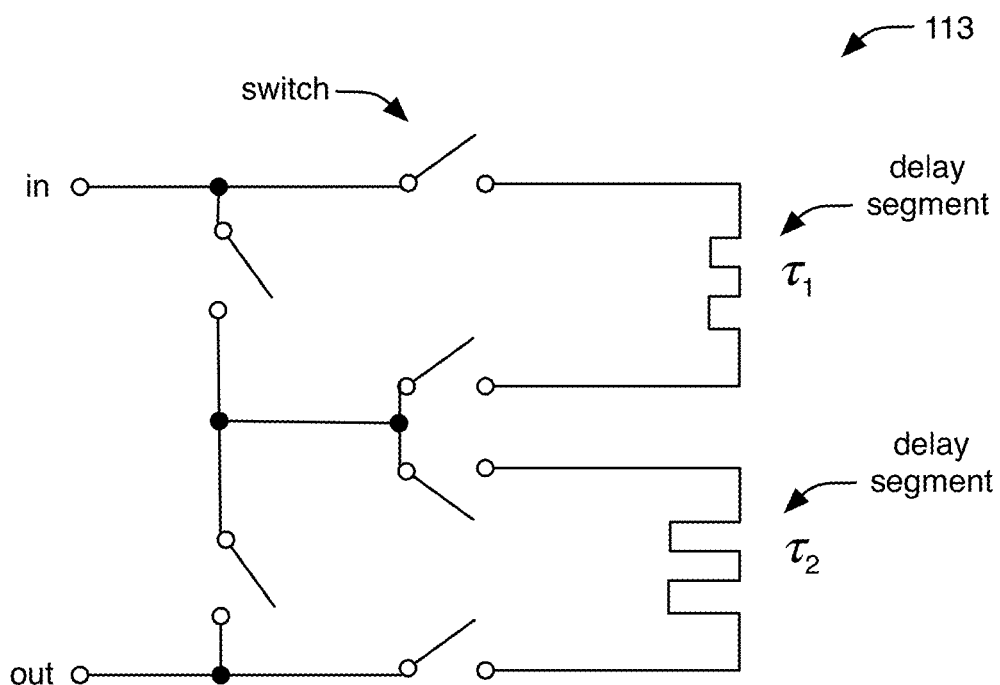
FIG. 3 is a schematic representation of an example of a switchable delay of the system.

In some such examples, a simple switch network to enable or disable each delay segment could allow undesired resonances to arise (e.g., from signal coupling into unused branches of the switch network). To avoid such undesired resonances, the switchable delay preferably includes multiple switches for each delay segment, thereby enabling isolation of unused segments from the circuit. For example, the switchable delay can include three switches (e.g., single-pole single-throw switches) for each delay segment (e.g., as shown in FIG. 3), thereby ensuring that signals are not coupled into unused delay segments (nor into unused bypass paths).

However, the delay can additionally or alternatively be operable to impose a fixed delay and/or be operable in any other suitable manner, and/or the analog taps can additionally or alternatively include any other suitable delays.

The tap filter 114 preferably functions to define a frequency range in which the analog tap affects (and/or does not affect) performance of the filter 90. For example, the tap filter 114 can function to isolate the performant frequency region of the analog tap (e.g., removing frequency regions that detract from, rather than enhance, filter 90 performance, and/or that otherwise may introduce undesired filter 90 performance characteristics). The tap filter 114 preferably performs frequency-based filtering (e.g., wherein the filter can include a high-pass filter, low-pass filter, band-pass filter, etc.). The tap filter cutoff frequency (or frequencies) is preferably tunable (e.g., enabling configuration of the location of the passband). Additionally or alternatively, the tap filter slope is preferably tunable and/or otherwise configurable. For example, the tap filter can include a plurality of filter stages, wherein one or more of the stages can be bypassed (e.g., a tap filter including two filter stages, such as with three filter poles per stage, wherein one of these filter stages can be bypassed for a low-slope configuration). The tap filter can optionally be operable to switch between different filter modes. For example, the tap filter can be operable to switch between two or more of a high-pass filter mode, a low-pass filter mode, a band-pass filter mode, a bypass mode in which no, or substantially no, filtering is performed, and/or any other suitable modes. However, the tap filter 114 can additionally or alternatively have any other suitable characteristics.

The coupling tuner 115 preferably functions to tune signal coupling to the analog tap (e.g., coupling into and/or out of the analog tap, such as from and/or to the primary signal path respectively). The coupling tuner preferably tunes coupling into the analog tap (and can additionally or alternatively function to reduce insertion loss associated with the tap, such as by reducing signal coupling into the analog tap in situations in which higher signal intensity is not required within the tap). The coupling tuner can additionally or alternatively function to increase overall signal scaling range (e.g., as the signal can be scaled both by the coupling tuner 115 and the scaler 111). For example, coarse attenuation can be provided by the coupling tuner 115, followed by fine tuning of attenuation at the scaler 111. The coupling tuner 115 preferably includes one or more capacitive elements (e.g., tunable capacitors), and can additionally or alternatively include one or more resistive elements (e.g., tunable resistors). However, the coupling tuner 115 can additionally or alternatively include any other suitable elements in any suitable arrangement.

As described above, some or all components of the analog taps (e.g., scalers 111, phase shifters 112, delays 113, tap filters 114, coupling tuners 115, etc.) are preferably configurable (e.g., operable to alter one or more operational characteristics, such as scaling factor, phase shift amount, delay time, etc.). Such configurability can be achieved by use of tunable elements (e.g., voltage-controlled elements, current-controlled elements, manually-tunable elements, etc.), by use of switched banks of separate elements (e.g., switched banks of non-tunable elements), and/or in any other suitable manner. However, any or all of the components of the analog taps (and/or any suitable characteristics thereof) can alternatively be fixed and/or have any other suitable properties.

Figure 2A:
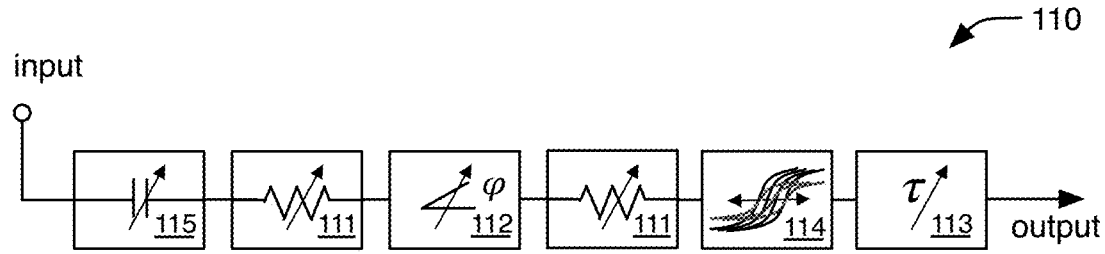
FIGS. 2A-2B are schematic representations of a first and second example, respectively, of an analog tap of the system.

In a first example (e.g., as shown in FIG. 2A), an analog tap 110 includes a series arrangement of elements that includes, in order from upstream to downstream: an upstream input (e.g., that functions to receive signals coupled into the analog tap from the primary signal path upstream of the filter 90), followed by a coupling tuner 115 (e.g., including a tunable capacitor, optionally followed by a tunable resistor), followed by a phase shifter 112 (e.g., tunable phase shifter), followed by a scaler 111 (e.g., tunable resistive attenuator), followed by a tap filter 114 (e.g., high-pass filter or low-pass filter, preferably configurable to adjust the filter slope and/or cutoff frequency), followed by a delay 113 (e.g., tunable or switchable delay), followed by a downstream output (e.g., which functions to provide signal for coupling back into the primary signal path downstream of the filter 90).

Figure 2B:
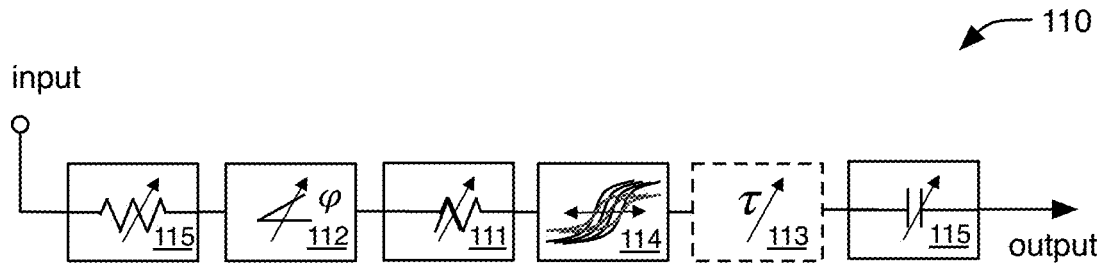

In a second example (e.g., as shown in FIG. 2B), an analog tap includes a series arrangement of elements that includes, in order from upstream to downstream: an upstream input (e.g., as described above regarding the first example), followed by a coupling tuner 115 (e.g., including a tunable resistor), followed by a phase shifter 112 (e.g., tunable phase shifter), followed by a scaler 111 (e.g., including a tunable resistive attenuator), followed by a tap filter 114 (e.g., as described above regarding the first example), optionally followed by a delay 113 (e.g., tunable or switchable delay), followed by a coupling tuner 115 (e.g., including a tunable capacitor), followed by a downstream output (e.g., as described above regarding the first example).

However, each analog tap 110 can additionally or alternatively include any suitable elements in any suitable arrangement.

3.2 Controller

The controller 120 preferably functions to control operation of the analog taps (e.g., to enhance performance of the filter 90, to perform the method 200 such as described below in more detail, etc.). For example, the controller can function to configure each tunable element of the taps (e.g., scalers, phase shifters, delays, filters, coupling tuners, etc.) and/or any suitable subset thereof.

Figure 4:
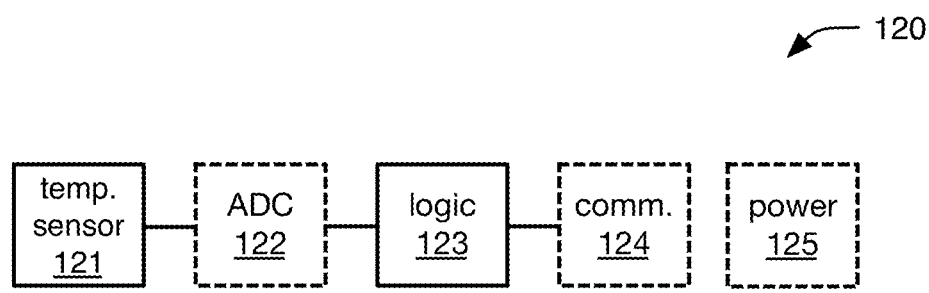
FIG. 4 is a schematic representation of an example of a controller of the system.

The controller 120 preferably includes one or more temperature sensors 121 and control logic 123, and can optionally include one or more analog-to-digital converters (ADCs) 122, communication interfaces 124, and/or power handling elements 125 (e.g., as shown in FIG. 1C and/or FIG. 4). However, the controller 120 can additionally or alternatively include any other suitable elements in any suitable arrangement.

The temperature sensor 121 preferably functions to sample the temperature of the system 100, the filter 90, and/or any other suitable elements (e.g., other locations near the system 100, filter 90, and/or associated elements). The temperature sensor is preferably colocated with the analog taps 110 (e.g., arranged on the same chip and/or within the same chip package as the analog taps), but can additionally or alternatively have any other suitable arrangement. In some examples, the controller can optionally include multiple temperature sensors arranged in different locations. The controller can additionally or alternatively include one or more inputs configured to receive information (e.g., information indicative of temperature measurements) from one or more remote temperature sensors, such as temperature sensors of an RF communication system (e.g., temperature sensors colocated with the filter 90 and/or having any other suitable arrangement).

The ADC 122 can function to convert a temperature sensor signal into digital temperature information. For example, the ADC 122 can include a flash ADC configured to compare a temperature sensor signal to one or more reference signals and output information (e.g., digital signal) representative of a temperature or temperature difference.

The control logic 123 preferably functions to determine appropriate configurations for the elements of the analog taps. The control logic preferably performs this determination based on temperature information (e.g., and/or based on pre-loaded data, such as data stored in OTP memory), but can additionally or alternatively perform the determination based on any other suitable information.

The control logic preferably includes one or more lookup tables (e.g., in one-time programmable (OTP) memory). The lookup tables are preferably indexed based on temperature (e.g., based on the temperature or temperature difference signal received from the ADC 122). Each bin (e.g., temperature bin) of a lookup table can include desired settings for each configurable element of the analog taps (and/or for any suitable subset thereof).

In some examples, the control logic can include multiple lookup tables. In some such examples, the different lookup tables can be associated with different high-level settings (e.g., different desired effects for each analog tap, such as filter edge temperature stabilization versus filter skirt extension stopband enhancement versus neighboring band stopband enhancement; different filters and/or filter characteristics, such as having one or more lookup tables for each filter SKU; etc.). Additionally or alternatively, the control logic can include the ability to transition between the multiple different lookup tables based on different temperature scenarios (e.g., enabling correction for non-linear temperature dependence, such as piecewise linear temperature dependence having a changing corner frequency). However the multiple lookup tables can additionally or alternatively be used in any other suitable manner, and/or the control logic can alternatively include only a single lookup table.

In some examples, the control logic can include hysteresis logic (e.g., configured to prevent rapid cycling between different configurations, such as setting the threshold for transitioning into a lower temperature bin at a slightly lower temperature than the thresholds for transitioning out of that lower temperature bin into the higher temperature bin). However, the control logic can additionally or alternatively perform any other suitable smoothing, and/or can be configured to control the analog taps in any other suitable manner.

In a first example, the control logic includes one or more lookup tables determined after integration of the system 100 with a filter 90 (and/or associated RF communication system), such as wherein the lookup tables are determined based on the thermal behavior of the specific integrated assembly (e.g., offsets between temperatures measured at the temperature sensor 121 and temperatures experienced at the filter 90, offsets accounting for correlations between temperatures measured at the temperature sensor 121 and behavioral effects such as frequency shifts exhibited by the filter 90, etc.).

In a second example, the lookup tables can be determined based on standard and/or expected behavior of a type of filter 90 (e.g., a particular filter model) and/or RF communication system, such as based on the expected thermal behavior of the filter 90, the RF communication system, and/or the integrated assembly. In this example, the control logic can additionally or alternatively include one or more process offset settings, which can be determined based on specific characteristics of the system 100, the filter 90, the RF communication system, and/or any other suitable elements (e.g., configured to account for manufacturing process variation, such as in tunable elements of the system and/or other elements, piezoelectric thickness of a BAW filter 90, etc.). For example, these process offset settings can be used to offset the relationship between temperature information received from the temperature sensor (e.g., via the ADC) and the lookup table (e.g., wherein a process offset of plus one can result in looking up a bin one greater than typical for a given input temperature information).

However, the control logic 123 can additionally or alternatively include any other suitable elements configured in any other suitable manner.

The controller 120 can optionally include one or more communication interfaces 124, which can function to enable remote inputs to and/or control of the controller (e.g., providing alternate lookup tables for use by the controller). In one example, the communication interface can include a serial peripheral interface (SPI). However, the controller can additionally or alternatively include any other suitable communication interfaces 124.

The controller 120 can optionally include one or more power handling elements 125. For example, the controller can include a power input (e.g., operable to receive electrical power, such as from an RF communications system into which the system is integrated), a power regulator (e.g., operable to deliver electrical power to other elements of the system, such as via one or more positive bias rails), and/or a negative bias element (e.g., operable to provide a negative bias to other elements of the system, such as via one or more negative bias rails) such as a charge pump. The power received at the power input is preferably provided to other elements of the system via the power regulator and/or the negative bias element, but can additionally or alternatively be used in any other suitable manner. However, the controller can additionally or alternatively include any other suitable power handling elements.

Additionally or alternatively, the system 100 can include one or more analog taps with fixed (or substantially fixed) configurations, wherein such a system can optionally omit the controller 120 (e.g., wherein the analog taps can be pre-configured with a fixed configuration, and so no controller is needed).

3.3 Couplers

The couplers 130 preferably function to couple signals into and/or out of the system 100 (e.g., between the primary signal path and the system). For example (e.g., as shown in FIG. 1B), the system 100 can include: a first coupler 130*a* configured to couple signals from the primary signal path (e.g., upstream of the filter 90) into the system 100, and a second coupler 130*b* configured to couple signals (e.g., the signals coupled into the system by the first coupler, after propagation through the analog taps) from the system 100 onto the primary signal path (e.g., downstream of the filter 90, such that the coupled signals bypass the filter 90).

In some examples, a coupler 130 can include (e.g., be) a short section directional transmission line coupler, but can additionally or alternatively include (e.g., be) any suitable power divider, power combiner, directional coupler, and/or other type of signal splitter. The signal coupler 130 is preferably a passive coupler, but may additionally or alternatively be an active coupler (for instance, including power amplifiers). In some examples, the coupler 130 can include: a coupled transmission line coupler, a branch-line coupler, a Lange coupler, a Wilkinson power divider, a hybrid coupler, a hybrid ring coupler, a multiple output divider, a waveguide directional coupler, a waveguide power coupler, a hybrid transformer coupler, a cross-connected transformer coupler, a resistive tee, and/or a resistive bridge hybrid coupler.

Figure 5:
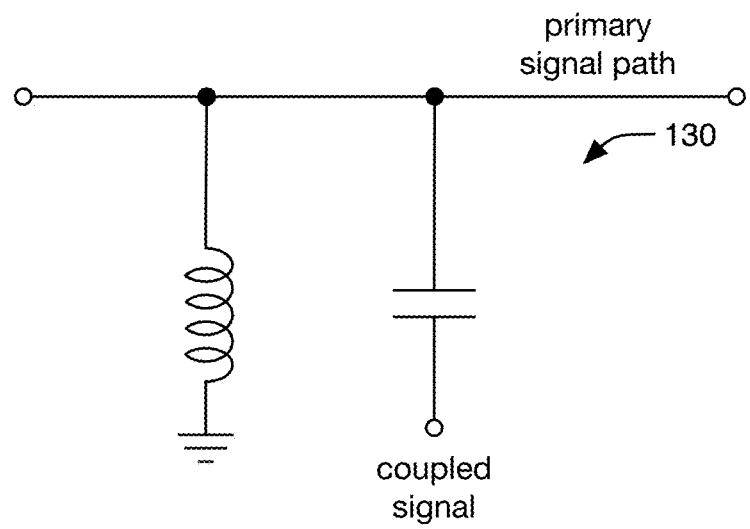
FIG. 5 is a schematic representation of an example of a coupler of the system.

In one example, the coupler 130 can include an inductor 131 coupling the primary signal path to ground and a capacitor 132 coupling the primary signal path to the system (e.g., as shown in FIG. 5). In a variation of this example (e.g., in which each analog tap includes a coupling tuner 115 with a capacitor), the capacitor 132 can be omitted (e.g., wherein the coupling tuners 115 can function as a capacitive coupling between the primary signal path and the system).

However, the system can additionally or alternatively include any other suitable couplers.

Further, the system can additionally or alternatively include any other suitable elements in any suitable arrangement.

4. Method

4.1 Calibrating the System

Calibrating the system S210 can function to determine and/or provide calibration information (e.g., temperature lookup tables) for system operation. S210 is preferably performed once (e.g., at the start of method performance and/or at any other suitable time; during system design, fabrication, testing, and/or integration such as integration with the filter 90 and/or RF communication system, etc.); however, S210 can additionally or alternatively be performed at any other suitable time(s) and/or performed any suitable number of times.

In some examples, S210 can be performed based on specifications associated with the system 100 and/or RF communication system (e.g., filter 90), such as performed in advance of integration of the system 100 with the filter 90 and/or the RF communication system.

Additionally or alternatively, S210 can be performed based on actual system 100 and/or RF communication system (e.g., filter 90) characteristics (e.g., wherein S210 is performed during and/or after integration of the system with the filter and/or RF communication system, such as performed based on observed behavior of the integrated assembly, such as temperature characteristics thereof).

S210 preferably includes storing calibration information, such as storing one or more lookup tables (e.g., temperature-indexed lookup tables) in OTP memory of the controller. In some examples, the lookup tables can additionally or alternatively be indexed based on delay configuration (e.g., delay time(s) associated with one or more variable delays, switch settings of one or more switchable delays, etc.), frequency parameters (e.g., cutoff frequency and/or slope for one or more tap filters, actual and/or desired passband frequencies for one or more filters 90, etc.), and/or any other suitable parameters associated with system operation. For example, system operation may dictate changing a delay configuration (e.g., switching from a first delay time to a second delay time); in response to such a change, one or more other analog tap configuration parameters may also be changed, such as wherein the lookup table(s) dictating these configuration parameters are selected and/or indexed based on the delay configuration (e.g., in addition to being indexed based on temperature). Additionally or alternatively, S210 can include pre-configuring tunable elements, pre-selecting fixed elements, and/or pre-configuring the system in any other suitable manner.

However, S210 can additionally or alternatively include calibrating the system in any other suitable manner. Further, S210 can additionally or alternatively be performed with any other suitable timing and/or performed based on any other suitable information.

4.2 Receiving Temperature Information

Receiving temperature information S220 can function to provide an input to the controller lookup tables (e.g., thereby enabling reduction and/or elimination of filter temperature dependences). The temperature information is preferably received from one or more temperature sensors of the system (but can additionally or alternatively be received from any other suitable temperature sensors, such as temperature sensors of the RF communication system). The temperature information is preferably provided to the controller (e.g., to the control logic thereof, such as via one or more ADCs).

S220 is preferably performed continuously, pseudo-continuously, or periodically, but can additionally or alternatively be performed sporadically, be performed in response to trigger events, and/or be performed with any other suitable timing.

However, S220 can additionally or alternatively include receiving any other suitable temperature information in any other suitable manner and/or with any other suitable timing.

4.3 Configuring Analog Taps

Configuring analog taps S230 preferably functions to configure tunable elements of the analog taps to provide desired filter enhancements. S230 is preferably performed based on temperature information. S230 is preferably performed in response to receiving the temperature information (e.g., in S220). The temperature information is preferably used as an input to one or more lookup tables (e.g., at the controller), wherein the tunable elements of the analog taps can be configured based on the information stored in the lookup tables (e.g., information associated with the temperature information received).

S230 is preferably performed continuously, pseudo-continuously, and/or periodically (e.g., with the same or similar timing as S220), but can additionally or alternatively be performed sporadically, in response to trigger events (e.g., receipt of temperature information), and/or with any other suitable timing.

However, S230 can additionally or alternatively include configuring the analog taps in any other suitable manner, and/or the method for filter enhancement can additionally or alternatively include any other suitable elements performed in any suitable manner.

Further, the method 200 can additionally or alternatively include any other suitable elements performed in any suitable manner.

An alternative embodiment preferably implements some or all of the above methods in a computer-readable medium storing computer-readable instructions. The instructions are preferably executed by computer-executable components preferably integrated with a communication routing system. The computer-readable medium may be stored on any suitable computer readable media such as RAMs, ROMs, flash memory, EEPROMs, optical devices (CD or DVD), hard drives, floppy drives, or any suitable device. The computer-executable component is preferably a processor but the instructions may alternatively or additionally be executed by any suitable dedicated hardware device.

Although omitted for conciseness, embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

I claim:

1. A system for filter enhancement, the system configured to be electrically coupled in parallel with a filter, the system comprising:
   an analog tap comprising:
     a variable attenuator;
     a variable phase shifter; and
     a delay; wherein the variable attenuator, the variable phase shifter, and the delay are electrically coupled in a series arrangement; and
   a controller operable to control the analog tap based on a temperature measurement, comprising dynamically tuning the variable attenuator and the variable phase shifter based on the temperature measurement, wherein the controller comprises:
     a temperature sensor operable to sample the temperature measurement;
     an analog-to-digital converter (ADC) configured to receive, from the temperature sensor, an analog temperature signal indicative of the temperature measurement, and to convert the analog temperature signal into a digital temperature signal indicative of the temperature measurement; and
     a digital control circuit configured to receive the digital temperature signal from the ADC and to determine, based on the digital temperature signal, a set of control signals operable to control the analog tap.

2. The system of claim 1, wherein the analog tap further comprises a coupling tuner electrically coupled in series with the variable attenuator, the variable phase shifter, and the delay.

3. The system of claim 1, wherein:
   the analog tap further comprises a tap filter electrically coupled in series with the variable attenuator, the variable phase shifter, and the delay;
   the tap filter defines a filter slope and a cutoff frequency, wherein the tap filter is operable to vary the filter slope and the cutoff frequency; and
   controlling the analog tap based on the temperature measurement further comprises, based on the temperature measurement, dynamically tuning at least one of the filter slope or the cutoff frequency.

4. The system of claim 1, wherein the digital control circuit comprises memory that stores a lookup table, wherein the lookup table is indexed based on a temperature index and stores values associated with the control signals.

5. The system of claim 4, wherein the memory is one-time programmable memory, wherein the digital control circuit is further configured to determine the temperature index based on the digital temperature signal and a temperature offset value.

6. The system of claim 1, wherein the analog tap and the temperature sensor are collocated within an integrated circuit package.

7. The system of claim 1, wherein the delay is a switchable delay.

8. The system of claim 7, wherein the switchable delay defines a delay input and a delay output, the switchable delay comprising:
   a first delay segment defining a first delay input end, a first delay output end, and a first delay time;
   a first bypass segment defining a first bypass input end and a first bypass output end, the first bypass output end electrically coupled to the delay output, the first bypass segment arranged electrically in parallel with the first delay segment;
   a first switch operable to electrically connect the delay input to the first delay input end;
   a second switch operable to electrically connect the delay input to the first bypass input end; and
   a third switch operable to electrically connect the first delay output end to the first bypass output end.

9. The system of claim 8, wherein the switchable delay further comprises:
   a second delay segment defining a second delay input end, a second delay output end, and a second delay time;
   a second bypass segment defining a second bypass input end and a second bypass output end, the second bypass output end electrically coupled to the delay output, the second bypass segment arranged electrically in parallel with the second delay segment;
   a fourth switch operable to electrically connect the first bypass output end to the second delay input end;
   a fifth switch operable to electrically connect the first bypass output end to the second bypass input end; and
   a sixth switch operable to electrically connect the second delay output end to the second bypass output end.

10. The system of claim 9, wherein the first delay time is substantially different from the second delay time.

11. The system of claim 7, wherein the controller is further operable to dynamically configure the switchable delay.

12. The system of claim 1, wherein:
   the analog tap further comprises a tap filter electrically coupled in series with the variable attenuator, the variable phase shifter, and the delay, the tap filter defining a first cutoff frequency;

the system further comprises a second analog tap electrically connected in parallel with the analog tap, the second analog tap comprising:
  a second variable phase shifter; and
  a second tap filter electrically connected in series with the second variable phase shifter, the second tap filter defining a second cutoff frequency; and
the controller is further operable to dynamically tune the second variable phase shifter.

13. The system of claim 12, wherein:
the first tap filter comprises a low-pass filter; and
the second tap filter comprises a high-pass filter.

14. The system of claim 12, wherein:
the second analog tap further comprises:
  a second variable attenuator electrically connected in series with the second variable phase shifter; and
  a second delay electrically connected in series with the second variable phase shifter and the second variable attenuator;
the system further comprises a variable coupling tuner electrically connected in series with either the analog tap or the second analog tap; and
the controller is further operable to dynamically tune the second variable attenuator and the variable coupling tuner.

* * * * *